United States Patent
Ritchey, Jr. et al.

(10) Patent No.: US 6,438,781 B1
(45) Date of Patent: Aug. 27, 2002

(54) WASHER FOR CLEANING SUBSTRATES

(75) Inventors: Joseph L. Ritchey, Jr., Morgan Hill; Johann F. Adam, Palo Alto; Evan F. Cromwell, Redwood City, all of CA (US)

(73) Assignee: Toda Citron Technologies, Inc., Milpitas, CA (US)

( * ) Notice: Subject to any disclaimer, the term of this patent is extended or adjusted under 35 U.S.C. 154(b) by 0 days.

(21) Appl. No.: 09/556,813

(22) Filed: Apr. 21, 2000

(51) Int. Cl.$^7$ .......................... A47L 15/00; B08B 3/00
(52) U.S. Cl. ...................... 15/88.3; 15/77; 15/102; 134/140; 134/149; 134/157; 134/902
(58) Field of Search .................. 15/77, 88.3, 102; 134/137, 140, 149, 157, 201, 902

(56) References Cited

U.S. PATENT DOCUMENTS

| | | | | |
|---|---|---|---|---|
| 4,782,545 A | * | 11/1988 | Aissa | 15/77 |
| 5,375,291 A | * | 12/1994 | Tateyama et al. | 15/302 |
| 5,725,414 A | * | 3/1998 | Moinpour et al. | 451/41 |
| 5,894,622 A | * | 4/1999 | Manfredi et al. | 15/102 |
| 5,933,902 A | * | 8/1999 | Frey | 15/102 |
| 6,003,185 A | * | 12/1999 | Saenz et al. | 15/77 |
| 6,070,284 A | * | 6/2000 | Garcia et al. | 15/102 |
| 6,082,377 A | * | 7/2000 | Frey | 134/6 |
| 6,163,916 A | * | 12/2000 | Terui et al. | 15/102 |

\* cited by examiner

Primary Examiner—Randy Gulakowski
Assistant Examiner—Joseph Perrin
(74) Attorney, Agent, or Firm—Silicon Valley Patent Group LLP; Michael J. Hulbert

(57) ABSTRACT

A washer includes driving and scrubbing rollers that press against the opposing surfaces of a substrate, which may be, e.g., a small form factor disk. The driving rollers and scrubbing rollers are approximately aligned along two different radii of the substrate that are separated by 180 degrees. The driving rollers rotate in opposite directions as do the scrubbing rollers. During the scrub cycle, the driving rollers cause the substrate to rotate, while the scrubbing rollers scrub the opposing surfaces of the substrate. Outside diameter rollers that are orthogonally positioned relative to the driving rollers and the scrubbing rollers, and which may be free spinning, contact the outside diameter of the substrate and hold the substrate in position during the scrub cycle. The substrate is loaded into the washer by lifting the substrate, via a lifting arm, to the driving and scrubbing rollers. The rotation of the driving and scrubbing rollers pulls the substrate into position with the outside diameter of the substrate in contact with the outside diameter rollers. The substrate may be unloaded by reversing the direction of rotation of the driving and scrubbing rollers and lowering the substrate away from the rollers or by separating the outside diameter rollers, which forces the substrate out from between the driving and scrubbing rollers.

18 Claims, 3 Drawing Sheets

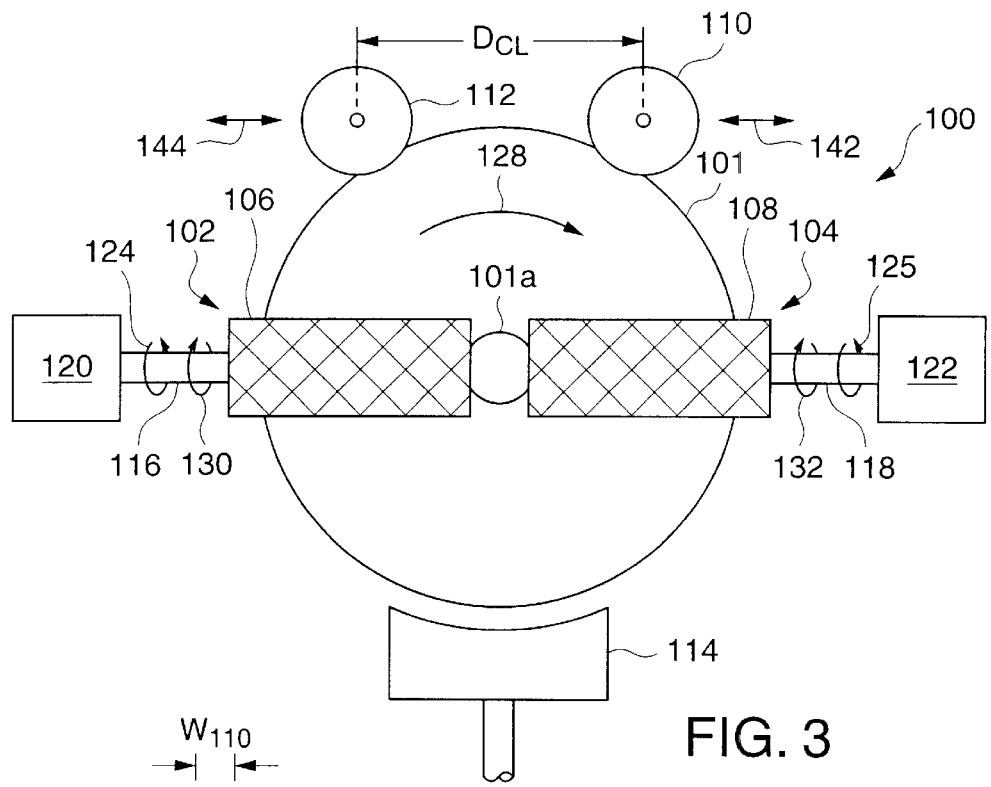
FIG. 3
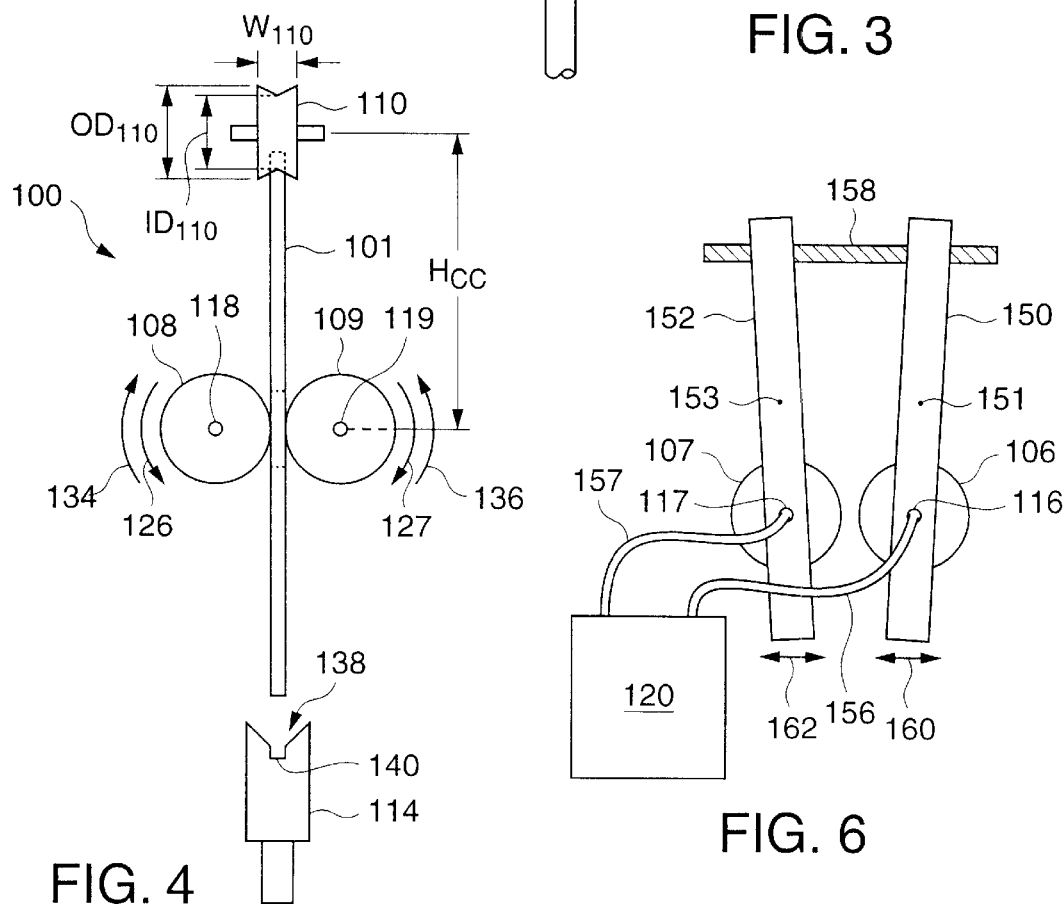
FIG. 4
FIG. 6

WASHER FOR CLEANING SUBSTRATES

FIELD OF THE INVENTION

The present invention relates to washers used for scrubbing the surfaces of substrates used in the production of recording media, and in particular to washers that use pads and/or brushes.

BACKGROUND

During the manufacture of recording media, such as magnetic or magnetic-optical disk, at least one cleaning step is performed. Typically, a brush (or pad) material is attached to a cylindrical roller that is pressed against the substrate surface. The brush is rotated and pressed against the substrate surface to scrub the disk. Typically, two rollers are used and pressed against opposite side of the substrate so that both surfaces are scrubbed simultaneously and no net pressure is applied to the disk, which could damage or break the disk.

FIGS. 1 and 2 show front and side views, respectively, of a conventional washer 10 cleaning a disk 12. Washer 10 includes two scrubbing rollers 14, 16 (roller 16 is hidden from view in FIG. 1) which are rotated as shown by arrow 15 in FIG. 1 and arrows 17 and 18 in FIG. 2. Scrubbing rollers 14 and 16 can be moved toward and away from the disk 12, as indicated by arrows 20 and 22, so that disk 12 may be easily loaded and unloaded. Washer 10 also includes driving rollers 24, 26 (roller 26 is hidden from view in FIG. 2), which contact the outside diameter of disk 12. Driving rollers 24, 26 are rotated, as indicated by arrows 25, 27 in FIG. 1 and arrow 28 in FIG. 2, to rotate disk 12 as indicated by arrow 13. A lift arm 30 is used to lift disk 12 into washer 10.

During operation, lift arm 26 lifts disk 12 into washer 10 and between scrubbing rollers 14 and 16, which are separated to allow disk to be lifted between them. Scrubbing rollers 14 and 16 are pressed against disk 12 and rotate as indicated by arrows 17 and 18 in FIG. 2. The rotation of scrubbing rollers 14 and 16 pushes disk 12 upwards against driving rollers 24 and 26. The rotation of driving rollers 24 and 26 causes disk 12 to rotate as indicated by arrow 13. Thus, as disk 12 rotates, scrubbing rollers 14 and 16 rotate and simultaneously scrub both sides of disk 12. Once disk 12 has been scrubbed driving rollers 24 and 26 stop, lift arm 30 raises to disk 12 and scrubbing rollers 14 and 16 separate. Lift arm 30 then lowers disk 12 from washer 10.

While a conventional washer, such as washer 10, operates adequately with large form factor disks, such as 95 mm disks, washer 10 has two key deficiencies when used to wash small form factor disks, such as one-inch disks. The first deficiency is caused by the edge of small form factor disks being sharper than larger form factor disks. The sharp edge of small form factor disks can cut into the driving rollers 24 and 26, particularly if there is any slippage between driving rollers 24 and 26 and the outside diameter of the disk. Cutting into driving rollers 24 and 26 can lead to contamination of the disk and undue wear on the driving rollers.

The second deficiency that occurs when washer 10 is used with small form factor disks occurs during insertion and removal of the disk from between the scrubbing rollers 14 and 16. Because small form factor disks have little weight, the disks tend to stick to the scrubbing rollers 14 and 16 from surface tension. Consequently, loading and unloading small form factor disks from washer 10 is problematic.

SUMMARY

A washer in accordance with an embodiment of the present invention uses two sets of rollers that are aligned along two different radii of a disk separated by 180 degrees. One set of rollers drives the rotation of the substrate while the other set of rollers scrubs the surfaces of the substrate. A set of outside diameter rollers, which are free spinning in one embodiment, are positioned to contact the outside diameter of the disk during the scrub cycle. With the outside diameter rollers free spinning, there is no slippage between the disk and the rollers, consequently the disk does not cut into the rollers. In another embodiment, the outside diameter rollers are rotated at the same speed as the outside diameter of the disk. In addition, the rotation of the driving and scrubbing rollers is used to pull the disk into the loaded position. The rotation of the driving and scrubbing rollers can be reversed to unload the disk. In another embodiment, the rotation of the driving and scrubbing rollers continues in the same direction and the outside diameter rollers separate to unload the disk. Because the driving and scrubbing rollers are not separated during loading and unloading, the disk is forced into and out of the scrub position and thus, the disk will not stick to the rollers.

Thus, in accordance with one embodiment of the present invention, an apparatus for washing substrates, such as small form factor disks, includes a first set of rollers including a first roller and a second roller each having an axis of rotation, the first roller axis and the second roller axis being perpendicular. The first and second rollers being on opposite sides of a substrate when a substrate is loaded. The washer also includes a second set of rollers including a third roller and a fourth roller, each having an axis of rotation, the third roller axis and fourth roller axis being perpendicular. The third and fourth rollers being on opposite sides of a substrate when a substrate is loaded. The washer also includes at least one outside diameter roller that is free spinning and that has an axis of rotation that is perpendicular to the axis of the first roller. The outside diameter roller is positioned to be in contact with the outside diameter of the substrate when a substrate is loaded. The rollers may have a brush material or a pad material attached. At least one motor is coupled to the first and second roller and at least one more motor is coupled to the third and fourth rollers.

The first set of rollers and second set of rollers may be positioned such that when a substrate is loaded between the rollers, the first set of rollers extend approximately along a first radius and the second set of rollers extend approximately along a second radius of the substrate, where the first radius is 180 degrees apart from the second radius. In addition, the first set of rollers and the second set of rollers extend from approximately the center of the substrate to past the outside diameter of the substrate so that the entire substrate can be washed. The first set of rollers and second set of rollers may be mounted on holders that are adjustable to increase or decrease the pressure that is applied to the substrate. In addition, the speed of rotation of the first set of rollers and the second set of rollers may be altered.

The washer also includes a lift arm that is positioned to lift a substrate to the first set and second set of rollers. The lift arm includes a "V" shaped groove in which a substrate may sit. The lift arm also includes a notch at the base of the "V" shaped groove, which is used to ensure that the substrate is held vertically when the substrate is loaded between the first set and second set of rollers.

In accordance with another embodiment of the present invention, a method of washing a substrate includes rotating a first pair of rollers in opposite directions, rotating a second pair of rollers in opposite directions, loading a substrate between the first pair of rollers and between the second pair of rollers, wherein the first pair of rollers presses against opposing surfaces of the substrate and the second pair of rollers also presses against the opposing surfaces of the substrate, rotating the substrate in the plane of the substrate with the first pair of rollers, and scrubbing the opposing surfaces of the substrate with the second pair of rollers. Loading the substrate includes lifting the substrate to the first pair of rollers and to the second pair of rollers; and pulling the substrate into position between the first pair of rollers and between the second pair of rollers with the outside diameter of the substrate pressed against at least one free spinning roller, wherein the rotation of the first pair of rollers and of the second pair of rollers pulls the substrate into position. Unloading the substrate includes pushing the substrate from between the first pair of rollers and between the second pair of rollers by reversing the direction of rotation of the first pair of rollers and of the second pair of rollers, and lowering the substrate from the first pair of rollers and from the second pair of rollers. In another embodiment, unloading the substrate includes separating at least two free spinning rollers that are in contact with the outside diameter of the substrate while continuing to rotate the first pair of rollers and continuing to rotate the second pair of rollers.

The method of washing a substrate also includes controlling the rate of rotation of the substrate, by adjusting the pressure on the substrate applied by at least one of the first pair of rollers and the second pair of rollers, or by altering the rate of rotation of at least one of the first pair of rollers and the second pair of rollers.

BRIEF DESCRIPTION OF THE DRAWINGS

FIGS. 3, 4, and 5 show respective front, side and top views of a washer with a disk loaded between a set of driving rollers and a set of scrubbing rollers in accordance with an embodiment of the present invention.

FIG. 6 shows a side view of roller holders that are used to hold rollers and to adjust the pressure that the rollers apply on a disk.

DETAILED DESCRIPTION

A washer in accordance with an embodiment of the present invention uses the rotation of scrubbing rollers to force a substrate into a loaded or unloaded position and to rotate the substrate during the scrubbing cycle. Thus, if the substrate is, e.g., a small form factor disk, the substrate, advantageously, will not cut into the outside diameter (top) rollers nor will the substrate stick to the scrubbing rollers during loading and/or unloading. It should be understood that the present invention may be used with any appropriate type of substrate, including disks such as magnetic and magnetic-optical memory disks.

Figures 1, 2:
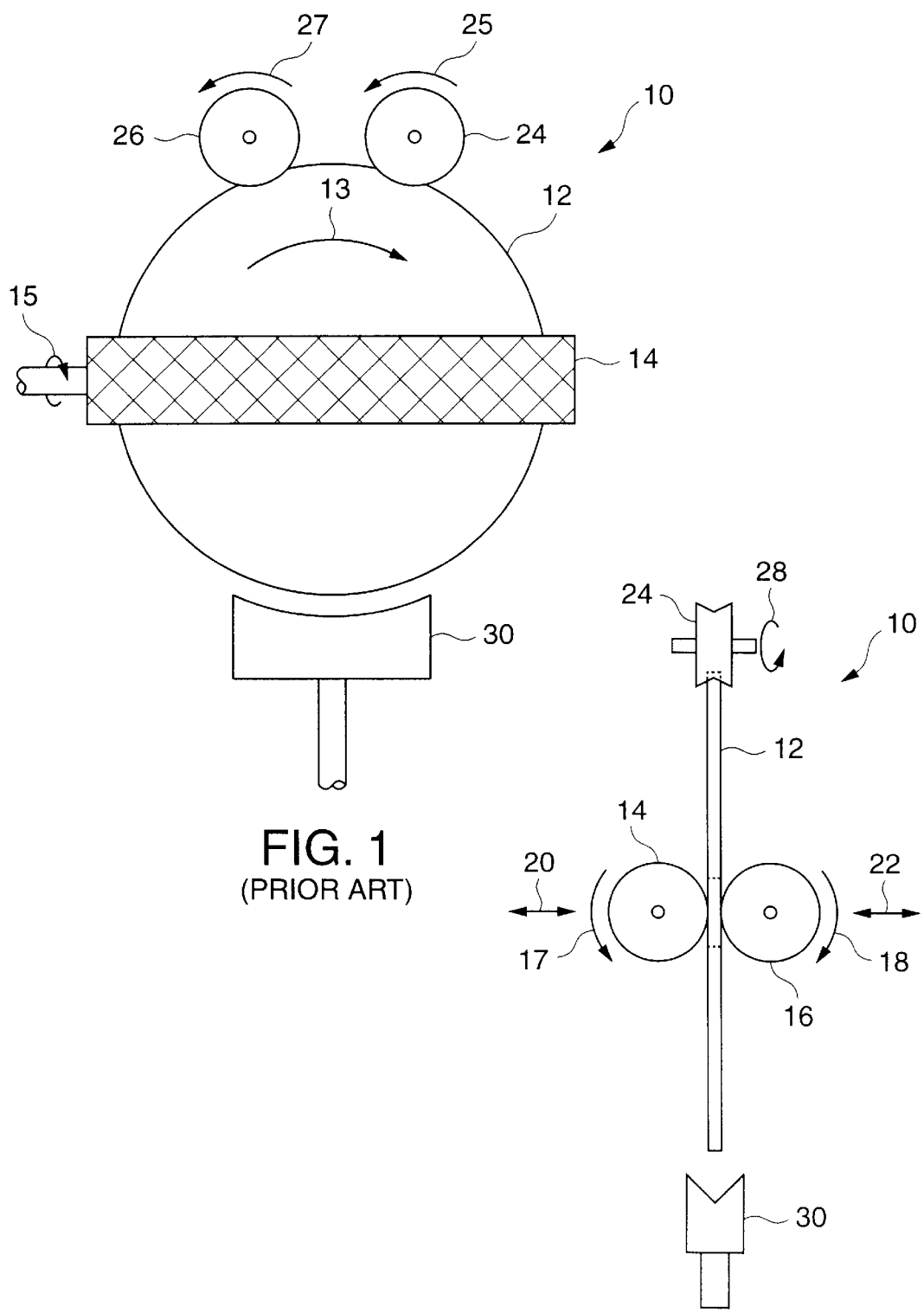
FIGS. 1 and 2 show front and side views, respectively, of a conventional washer cleaning a disk.
Figure 5:
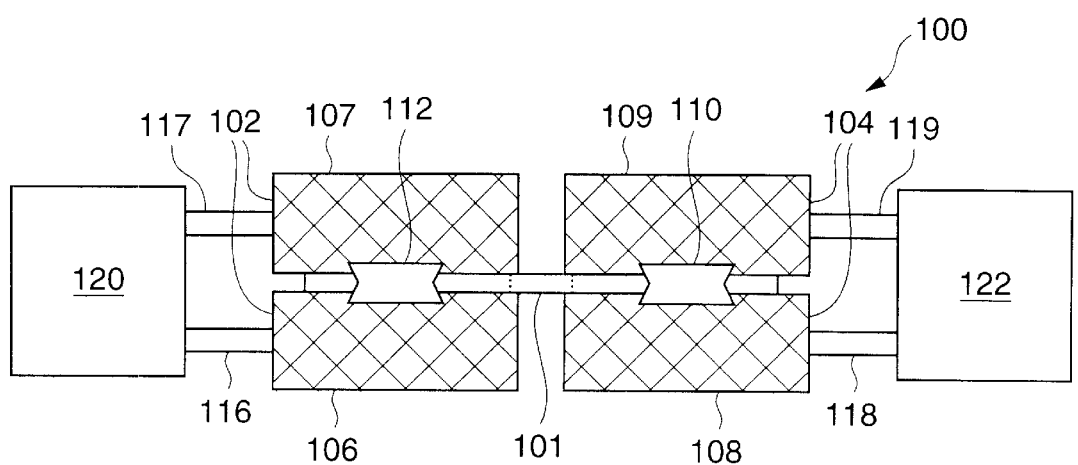

FIGS. 3, 4, and 5 show respective front, side and top views of a washer 100 with a substrate, shown as disk 101, loaded between two sets 102 and 104 of scrubbing rollers, in accordance with an embodiment of the present invention. Each set 102 and 104 includes two scrubbing rollers for a total of four scrubbing rollers. Set 102 includes rollers 106 and 107, which contact opposite sides of disk 101 and are used to drive the rotation of disk 101 during washing. Set 104 includes rollers 108 and 109, which also contact opposite sides of disk 101 and are used to scrub disk 101 during the scrub cycle. It should be understood that rollers 104 and 105 are hidden from view in FIG. 3 and rollers 102 and 104 are hidden from view in FIG. 4. Washer 100 also includes top rollers 110 and 112, which are free spinning rollers, and a lift arm 114 used during loading and unloading of disk 101.

As shown in FIG. 3, driving roller set 102 and scrubbing roller set 104 contact disk 101 along a radius from approximately the center of disk 101 to past the outside diameter of disk 101. As can be seen in FIG. 3, disk 101 typically has a hole 101a in the center. Thus, rollers 106–109 need not contact disk 101 at the center of the disk 101, but from the inside diameter formed by hole 101a to the outside diameter of disk 101. The two sets 102 and 104 are aligned approximately on two radii that are 180 degrees apart. Of course, the two sets of rollers 102 and 104 need not be aligned precisely on the radii of disk 101, however, disk 101 will be held with increased security if the two sets of rollers 102 and 104 are closely aligned with the radii. Thus, where washer 100 is used to scrub a one inch disk, each roller 106–109 may be approximately one inch long and approximately one inch in diameter. Rollers 106–109 may have, for example, a 16.5 mm outside diameter, a 4.5 mm inside diameter and are 12.7 mm long and may be made from a PVA brush roller, for example, PVA-67 manufactured by Rippey, Inc. located in Sacramento Calif. Each roller 106, 107, 108, and 109 is mounted on a shaft 116, 117, 118, and 119, respectively, and is driven by motors, shown schematically as blocks 120 and 122 in FIGS. 3 and 5.

As shown in FIGS. 3 and 5, motor 120 may drive the rotation of both rollers 106 and 107 in driving roller set 102, while motor 122 may drive the rotation of both rollers 108 and 109 in scrubbing roller set 104. In another embodiment, however, a respective individual motor controls each individual roller. It should be understood that while the link between motors 120 and 122 and rollers 106–109 is shown as a direct link to shafts 116–119, any type of drive train may be used, including cables, gears, and magnetic bearings. Motors 120 and 122 may be standard DC motors, which may be purchased from Maxon Motor, located in Switzerland, and may use a gear ratio such as 60:1 to drive the rollers.

Advantageously, loading and unloading of disk 101 in washer 100 is accomplished with the rollers 106–109 in motion and set in the scrubbing positions, i.e., rollers 106–109 do not move away from and towards disk 101 during loading and unloading. During loading, disk 101 is mounted on lift arm 114 and raised up to rollers 106–109, which are rotating in the direction indicated by arrows 124 and 125 in FIG. 3 and arrows 126 and 127 in FIG. 4. Disk 101 is pulled upward by the rotational force of rollers 106–109 until the outside diameter of disk 101 contacts top rollers 110 and 112.

Top rollers 110 and 112 have a "V" shape into which the outside diameter of disk 101 is fed during loading as shown in FIG. 4. Top rollers 110 and 112 have a width $W_{110}$ of approximately 0.426 inches, an outside diameter $OD_{110}$ of approximately 0.60 inches, and an inside diameter $ID_{110}$ (at the inside of the "V") of approximately 0.326 inches. Top rollers 110 and 112 may be manufactured out of plastic, such as Delrin, or another suitable material. The center lines of top rollers 110 and 112 are positioned at a height HCL of approximately 0.5 inches above the center line of rollers 106–109, and a distance DCL of approximately 0.7 inches apart. It should be understood, of course, that the precise dimensions and locations of top rollers 110 and 112 may be altered, but that top rollers 110 and 112 should be large enough and positioned such that during loading, the outside diameter of disk 101 will be fed into the "V" shape by rollers 106–109. The centerline or plane of the disk 101 should be maintained within close tolerance as it is being loaded, e.g., ±0.010 inches.

To scrub disk 101, rollers 106–109 continue to rotate in the same direction with disk 101 in contact with top rollers 110 and 112. Driving roller sets 102 are pressed against disk 101 with a higher pressure than scrubbing roller sets 104. Thus, a differential rotational force is applied to disk 101 by the higher pressure rotation of driving roller set 102, as indicated by arrow 124 in FIG. 3, and the lower pressure rotation of scrubbing roller set 104, which causes disk 101 to rotate in the plane of disk 101 as indicated by arrow 128. Scrubbing roller set 104 continues to rotate in the direction indicated by arrows 125 (FIG. 3) and 127 (FIG. 4). Because driving roller set 102 is pressed against disk 101 with a higher pressure than scrubbing rollers set 104, disk 101 slips between scrubbing rollers 108 and 109 while disk 101, thereby scrubbing the surfaces of the disk. Top rollers 110 and 112 hold disk 101 in place while disk 101 rotates during the scrubbing process. Top rollers 110 and 112 are free spinning and thus rotate with disk 101. Because top rollers 110 and 112 do not drive the rotation of disk 101, no slippage occurs which prevents disk 101 from cutting into rollers 110 and 12. In another embodiment, top rollers 110 and 112 may be driven at the same speed as the outside diameter of disk 101. In this embodiment, top rollers 110 and 112 may be driven by motors 120 and 122 but with a different gear ratio than used to drive rollers 106–109.

Washer 100 may use a conventional scrub environment during the scrub cycle. Thus, for example, a conventional wet environment with, e.g., alkaline soaps, may be used as is well understood by those of ordinary skill in the art. Of course, any desired environment may be used with the present invention.

After the scrub cycle is finished, the direction of rotation of both roller sets 102 and 104 is reversed, as indicated by arrows 130 and 132 in FIG. 3 and arrows 134 and 136 in FIG. 4, thereby pushing disk 101 out from between the rollers and into a "V" groove 138 in lift arm 114. The "V" groove 138 in lift arm 114 aids in ensuring that disk 101 is properly loaded into lift arm 114. In addition, lift arm 114 advantageously includes a small notch 140 at the bottom of the "V" groom 138. Notch 140 is approximately the width of disk 101, e.g., approximately 0.012 inches wide, and assists in holding disk 101 in a vertical position during loading and unloading of disk from washer 100. If disk 101 were permitted to lean at an angle from vertical, e.g., during loading, disk 101 may not be properly positioned to be pulled upward by rollers 106–109. Thus, with the inclusion of notch 140 disk 101 can be held in an appropriate position for loading into washer 100. This embodiment may be appropriate, e.g., when a process cassette is used, i.e., the disk is picked up out of the cassette by lift arm 114 and returned to the cassette after the scrub cycle. The operation of lift arm 114 into a raised and lowered position may be controlled by, e.g., a linear actuator and is well within the knowledge of those of ordinary skill in the art.

In another embodiment of the present invention, during the unloading process, top rollers 110 and 112 are separated as indicated by arrows 142 and 144, respectively. Rollers 106–109 continue to rotate in the same direction as during loading and the scrubbing cycle, as indicated by arrows 124 and 125 (FIG. 3), which pushes disk 101 out of washer 100 away from lift arm 114. Of course, another lift arm (not shown) or equivalent apparatus is located on the opposite end of washer 100 to receive disk 101 as disk 101 is unloaded in this embodiment. This embodiment may be appropriate, e.g., for an in-line process where disk 101 is directed from one scrub station to the next station without the use of a process cassette.

The pressure on disk 101 that is applied by rollers 106–109 may be adjusted so that disk 101 rotates at the desired rate. FIG. 6 shows a side view of roller holders 150 and 152 that are used to hold rollers 106 and 107, respectively. Rollers 108 and 109 may be mounted on similar holders. During scrubbing the centerline of rollers are approximately 0.3 inches apart, which includes the radii of the rollers, the thickness of the disk, as well as compression of the rollers. Shafts 116 and 117, upon which rollers 106 and 107 are mounted, extend through holders 150 and 152. As shown in FIG. 6, cables 156 and 157 extend from motor 120 to shafts 116 and 117 and are used to rotate rollers 106 and 107. Each of the roller holders 150 and 152 are rotatably mounted at a point 151 and 153, respectively. Roller holders 150 and 152 are coupled together with a screw 158 or similar device, such that brush holders 150 and 152 can open and close in a scissors-like action by adjusting screw 158. Thus, driving rollers 106 and 107 can be moved away or towards each other as indicated by arrows 160 and 162 or decrease pressure on disk 101 (shown in FIGS. 3, 4, and 5).

The pressure on disk 101 may be calibrated using a calibration disk that is marked on a surface. The calibration disk is loaded into washer and driving rollers set 102 rotates the calibration disk while scrubbing rollers set 104 scrubs the calibration disk. If the driving rollers set 102 and the scrubbing rollers set 104 apply the same amount of pressure to the calibration disk, the disk will not rotate. By increasing the pressure that is applied by driving rollers set 102, the calibration disk will be forced to rotate. The more pressure that is applied by driving rollers set 102, the faster the calibration disk will rotate. Thus, adjusting screw 158 may control the speed of rotation of a disk. An appropriate speed of rotation of a disk during a scrub cycle is, e.g., 1 to 10 revolutions per minute, but of course, this may vary depending on many factors. The scrub cycle should be long enough to adequately clean disk 101 as determined by an independent inspection, and is for example a 18 second scrub cycle and the load and unload cycle is approximately 4 seconds each.

In another embodiment of the present invention, the driving rollers set 102 and scrubbing rollers set 104 may apply the same or approximately the same pressure on disk 101 and the rotation of disk 101 is caused by the two sets 102 and 104 being manufactured from different materials. Thus, driving rollers set 102 may be manufactured from a material that has an increased coefficient of friction relative to the scrubbing rollers set 104. In another embodiment of the present invention, the driving rollers set 102 is driven at a higher rate of rotation than the scrubbing rollers set 104, which will also cause disk 101 to rotate as indicated by arrow 13. In another embodiment, the driving rollers set 102, the scrubbing rollers set 104 or both may have a conical shape which evenly distributes the force on disk 101 from the inside diameter to the outside diameter. Of course, if desired any combination of the embodiments may be used. Thus, for example, driving rollers set 102 may be manufactured from different material and driven at a higher rate of rotation and held against disk 101 with more pressure than scrubbing rollers set 104.

Although the present invention is illustrated in connection with specific embodiments for instructional purposes, the present invention is not limited thereto. Various adaptations and modifications may be made without departing from the scope of the invention. For example, the size of the washer may be altered to accommodate any size substrate. Further, different lift mechanisms may be used to load and/or unload substrates from the washer. The washer in accordance with the present invention may be used in any desired environment including wet, dry, alkaline, or acidic. The drive train from the motors to the driving and scrubbing rollers may be varied in any desired way. Accordingly, all such changes come within the scope of the invention as recited below.

What is claimed is:

1. An apparatus for washing a substrate, said apparatus comprising:

a first set of rollers comprising a first roller and a second roller, said first roller having an axis about which said first roller rotates and said second roller having an axis about which said second roller rotates, said first roller axis and said second roller axis being parallel to the plane of said substrate, wherein when a substrate is loaded between said first roller and said second roller, said first roller and said second roller are on opposite sides of said substrate;

a second set of rollers comprising a third roller and a fourth roller, said third roller having an axis about which said third roller rotates and said fourth roller having an axis about which said fourth roller rotates, said third roller axis and said fourth roller axis being parallel to the plane of said substrate, said first roller axis and said third roller axis being parallel to each other and being located one side of said substrate, said second roller axis and fourth roller axis being parallel to each other and being located one side of side substrate, wherein when a substrate is loaded between said third roller and said fourth roller, said third roller and said fourth roller are on opposite sides of said substrate; and at least one outside diameter roller that has an axis of rotation that is perpendicular to said first roller axis, wherein when a substrate is loaded between said first and second rollers and between said third and fourth rollers the outside diameter of said substrate contacts said at least one outside diameter roller.

2. The apparatus of claim 1, wherein said first roller, second roller, third roller, and fourth roller have a brush material attached.

3. The apparatus of claim 1, wherein said first roller, second roller, third roller, and fourth roller have a pad material attached.

4. The apparatus of claim 1, further comprising:

at least one motor coupled to said first roller and said second roller, said at least one motor drives the rotation of said first roller and said second roller; and a second at least one motor coupled to said third roller and said fourth roller and that drives the rotation of said third roller and said fourth roller.

5. The apparatus of claim 4, wherein said at least one motor coupled to said first roller and said second roller comprises a first motor coupled to said first roller and a second motor coupled to said second roller, and wherein said second at least one motor coupled to said third roller and said fourth roller comprises a third motor coupled to said third roller and a fourth motor coupled to said fourth roller.

6. The apparatus of claim 1, wherein when a substrate is loaded between said first and second rollers and said third and fourth rollers, said first set of rollers extend approximately along a first radius of said substrate and said second set of rollers extend approximately along a second radius of said substrate, said first radius is 180 degrees apart from said second radius.

7. The apparatus of claim 6, wherein said first set of rollers and said second set of rollers extend from approximately the center of said substrate to past the outside diameter of said substrate.

8. The apparatus of claim 1, further comprising:

a lift arm positioned below said first set of rollers and said second set of rollers, said lift arm loads substrates between said first and second rollers and said third and fourth rollers.

9. The apparatus of claim 8, wherein said lift arm comprises a "V" shaped groove to accommodate substrates and a notch at the base of said "V" shaped groove.

10. The apparatus of claim 1, further comprising:

a first roller holder that is mounted to said first roller and a second roller holder that is mounted to said second roller, said first holder and said second holder being adjustably coupled to move said first roller and said second roller towards and away from each other.

11. The apparatus of claim 1, wherein said first roller axis and said second roller axis are closer together than said third roller axis and said fourth roller axis, such that said first roller set applies more pressure on a substrate than said second set of rollers when a substrate is loaded between said first and second rollers and said third and fourth rollers.

12. The apparatus of claim 1, wherein said first set of rollers rotate faster than said second set of rollers when a substrate is loaded between said first and second rollers and said third and fourth rollers.

13. The apparatus of claim 1, wherein there are two outside diameter rollers each having an axis of rotation that is perpendicular to said first roller axis, said outside diameter rollers being movable towards and away from each other to permit a substrate to be unloaded from between said two outside diameter rollers.

14. The apparatus of claim 1, wherein said at least one outside diameter roller is free spinning.

15. A washer for cleaning substrates, said washer comprising:

a pair of driving rollers pressed against opposing surfaces of said substrate, said pair of driving rollers driving the rotation of said substrate within the plane of said substrate, said pair of driving rollers having axes of rotation that are substantially parallel with said plane of said substrate;

a pair of scrubbing rollers pressed against said opposing surfaces of said substrate, said pair of scrubbing rollers scrubbing said opposing surfaces of said substrate while said substrate rotates within said plane of said substrate; and at least one orthogonally positioned roller in contact with the outside diameter of said substrate.

16. The washer of claim 15 wherein said pair of driving rollers are aligned approximately along a first radius of said substrate and said pair of scrubbing rollers are aligned approximately along a second radius of said substrate.

17. The washer of claim 16, wherein said first radius and said second radius are separated by approximately 180 degrees.

18. The washer of claim 15, further comprising a lift arm for lifting said substrate to said pair of driving rollers and said pair of scrubbing rollers.

* * * * *